(12) United States Patent
Liskow (10) Patent No.: US 9,516,750 B2
(45) Date of Patent: Dec. 6, 2016

(54) CONTROL UNIT FOR A MOTOR VEHICLE
(71) Applicant: Robert Bosch GmbH, Stuttgart (DE)
(72) Inventor: Uwe Liskow, Asperg (DE)
(73) Assignee: Robert Bosch GmbH, Stuttgart (DE)
( * ) Notice: Subject to any disclaimer, the term of this patent is extended or adjusted under 35 U.S.C. 154(b) by 201 days.
(21) Appl. No.: 14/363,541
(22) PCT Filed: Nov. 20, 2012
(86) PCT No.: PCT/EP2012/073069
§ 371 (c)(1),
(2) Date: Jun. 6, 2014
(87) PCT Pub. No.: WO2013/087371
PCT Pub. Date: Jun. 20, 2013

(65) Prior Publication Data
US 2014/0365090 A1    Dec. 11, 2014

(30) Foreign Application Priority Data
Dec. 13, 2011    (DE) .......................... 10 2011 088 335

(51) Int. Cl.
*F16H 61/02*    (2006.01)
*H05K 1/11*    (2006.01)
*H05K 1/02*    (2006.01)
*H05K 3/30*    (2006.01)
(Continued)
(52) U.S. Cl.
CPC ............. *H05K 1/11* (2013.01); *F16H 61/0251* (2013.01); *H05K 1/021* (2013.01); *H05K 1/0296* (2013.01); *H05K 1/112* (2013.01); *H05K 1/181* (2013.01); *H05K 3/303* (2013.01); *H05K 3/3421* (2013.01); *H05K 2201/10424* (2013.01); *H05K 2201/2018* (2013.01); *Y02P 70/613* (2015.11)
(58) Field of Classification Search
None
See application file for complete search history.

(56) References Cited

U.S. PATENT DOCUMENTS 4,735,582 A    4/1988    Fusselman et al.
4,826,068 A    5/1989    Yagoura et al.
(Continued)

FOREIGN PATENT DOCUMENTS

CN    102196713 A    9/2011
EP    0 420 050 A2    4/1991
(Continued)

OTHER PUBLICATIONS

International Search Report corresponding to PCT Application No. PCT/EP2012/073069, mailed Feb. 4, 2014 (German and English language document) (7 pages).

*Primary Examiner* — Edwin A Young
(74) *Attorney, Agent, or Firm* — Maginot, Moore & Beck LLP (57)    ABSTRACT

A control unit for a motor vehicle has an electrical SMD (surface mounted device) component having at least one corresponding connection pin and a circuit board. The circuit board has at least one soldering surface. The soldering surface is permanently connected to the circuit board. The soldering surface and the connection pin are connectable to each other in an electrically conductive and firmly bonded manner by a soldering process. According to the disclosure, a contact hold-down piece is permanently connected to the circuit board. The connection pin is positioned in such a manner by the contact hold-down piece that, when the connection pin is connected to the soldering surface in an integrally bonded manner, the connection pin and the circuit board have a predetermined distance from each other.

10 Claims, 4 Drawing Sheets

(51) Int. Cl.
   *H05K 3/34*    (2006.01)
   *H05K 1/18*    (2006.01)

(56) References Cited

U.S. PATENT DOCUMENTS

| | | | |
|---|---|---|---|
| 5,051,813 A | 9/1991 | Schneider et al. | |
| 5,354,207 A | 10/1994 | Chikano | |
| 5,766,027 A * | 6/1998 | Fogg | H01R 13/6658 439/76.1 |
| 6,819,127 B1 * | 11/2004 | Hembree | G01R 1/0483 324/750.25 |
| 2002/0166696 A1 * | 11/2002 | Chamberlin | H05K 3/225 174/262 |
| 2007/0187844 A1 * | 8/2007 | Chen | H01L 23/041 257/789 |

FOREIGN PATENT DOCUMENTS

| | | |
|---|---|---|
| JP | 10-224019 A | 8/1998 |
| WO | 2008/049724 A1 | 5/2008 |

* cited by examiner

CONTROL UNIT FOR A MOTOR VEHICLE

This application is a 35 U.S.C. §371 National Stage Application of PCT/EP2012/073069, filed on Nov. 20, 2012, which claims the benefit of priority to Serial No. DE 10 2011 088 335.5, filed on Dec. 13, 2011 in Germany, the disclosures of which are incorporated herein by reference in their entirety.

BACKGROUND

Electronic control units are required for the purpose controlling different applications in automotive engineering. The electronic control units comprise electric components, such as control modules for controlling actuators and sensors, and also at least one plug connection for providing a connection to an automotive wiring harness. Control modules of this type are required by way of example for the purpose of controlling switching procedures in modern automatic transmissions that are arranged in many cases inside the transmission housing. The control modules are constructed so that they are completely or in part covered by transmission oil and are subjected to temperatures of −40 C to +150 C that can occur in transmissions of this type. It is known to provide control modules of this type, which can comprise up to 100 connection pins and more, not as a THT (through-hole technology) component, in other words with connection pins that are pushed through a circuit board but rather to embody said control modules as an SMD (surface-mounted device) component and to connect said component in an electrically conductive manner to a corresponding circuit board. However, it has been established in individual cases that following the procedure of soldering the control unit not all connection pins were connected in an electrically conductive manner to the soldering areas of the circuit board or that not all solder joints were performed in an optimum manner.

SUMMARY

Therefore, there may be a requirement to provide a control unit in which the connection pins of the SMD component are reliably connected in an electrically conductive manner to the soldering areas of the circuit board following the soldering process.

This requirement can be fulfilled by means of the subjects of the description below. Advantageous embodiments of the disclosure are evident in the subjects of the description below.

In accordance with a first exemplary embodiment of the disclosure, a control unit is provided for a motor vehicle. The control unit comprises an electric SMD (surface-mounted device) component having at least one connection pin and a circuit board. The circuit board comprises at least one soldering area. The soldering area is connected in a non-detachable manner to the circuit board. The soldering area and the connection pin are bonded to one another in an electrically conductive manner by means of a soldering process. A contact-making holding-down device is fixedly connected to the circuit board. The connection pin is positioned by means of the contact-making holding-down device in such a manner that if the connection pin is bonded to the soldering area there is a predefined spacing between the connection pin and the circuit board.

The connection pin of the electric SMD component is embodied for the purpose of providing a bonded connection with the soldering area during the surface mounting procedure. The connection pin is generally tin-plated by means of solder. The electric SMD component can comprise up to 100 and more connection pins and can be embodied as a control module that controls switching procedures within an automatic transmission in a motor vehicle. In an initial phase, if the connection pin is not yet soldered to the circuit board or rather to the soldering area, the holding-down device pushes the connection pin against the tin-plated soldering area, wherein the holding-down device can be pre-stressed. The holding-down device renders it possible to avoid that one of the connection pins, which in its initial position would not lie against the tin-plated soldering area, would be pushed against the soldering area by way of example for soldering purposes by means of a thermode and following the removal of a thermode would spring back into its initial position as a result of the resilient restoring properties of the connection pin and would pull out of the solder that is still liquid. The connection pin is pushed by means of a thermode against the tin-plated solder area of the circuit board and the solder paste that is located on the soldering area is liquefied. The hot thermode is pulled out of the solder that is still liquid. As a result of removing the hot thermode, the liquid solder cools down and solidifies. Since the solder is still liquid for a specific period of time following the removal of the thermode, the connection pin can be pulled out of the liquid solder as a result of restoring forces. If, by way of example, the thermode has become scaled, it is possible for a poor transmission of heat to occur from the thermode to the connection pin. Although the thermode can possibly cause the solder to liquefy, the temperature achieved is not in fact sufficient that the thermode can become detached from the connection pin as it is pulled out. Consequently, the connection pin can possibly likewise be pulled out of the liquid solder as the thermode is pulled out of the liquid solder. When using a process of liquefying the solder or a solder paste in a non-contact manner, by way of example by means of a light beam or a laser beam, the thermode is in fact prevented from adhering to the connection pin, or a poor transmission of heat as a result of the scaling of the thermode surface is prevented. However, as a result of shape tolerances and position tolerances or as a result of said connection pins deforming as a result of the component being incorrectly handled, it is possible that individual connection pins are not positioned sufficiently close to the soldering area of the circuit board so that solder is not applied properly. This leads to the electric SMD component falling out. The circuit board can be embodied in a rigid or flexile manner. If the circuit board is embodied in a flexible manner, then the circuit board is generally supported by means of a supporting element so that the holding-down device can position the connection pin against the soldering area. If the circuit board is embodied in a rigid manner, generally circuit boards of the FR4 design or more are used, in other words circuit boards that are embodied from glass fiber reinforced epoxy resin. The holding-down device is fixedly connected to the circuit board during the initial phase, in other words prior to the soldering process, and remains connected thereto during the entire serviceable life of the control unit. It is also possible by means of the holding-down device to avoid that the connection pin is pulled out of the liquid solder either as a result of restoring forces or as a result of a scaled thermode. In fact, the contact-making holding-down device can ensure that there is a predefined spacing between the connection pin and the circuit board so that the solder joint can be performed in an optimum manner. Only a solder joint that is performed in an optimum manner ensures that there is sufficient mechanical loadability with respect to tensile forces and/or shearing forces that occur. This mechanical loadability is necessary so that the solder joint, in particular, if it is subjected to vibrations, is not shattered during the operation. Furthermore, the contact-making holding-down device can have a damping effect on the solder joint when subjected to a loading as a result of vibration. This can also effectively counteract a shattering of the solder joint during the operation. Furthermore, the contact-making holding-down device can also be used for the connection pins of components that are soldered using a reflow oven. In order for the contact-making holding-down device to be able to generate its vibration-damping effect, the contact-making holding-down device will generally push on the connection pin even following the soldering process, in other words said contact-making holding-down device will have a predefined magnitude of pre-stress.

In accordance with a further exemplary embodiment of the disclosure, the connection pin comprises a first surface and a second surface that lies opposite the first surface. The first surface faces the soldering area. The contact-making holding-down device acts on the second surface.

By means of an arrangement of this type, the connection pin is pushed in the direction of the soldering area and not in the direction of the solder joint. This facilitates the configuration of the contact-making holding-down device and the production of said device.

In accordance with a further exemplary embodiment of the disclosure, the second surface comprises a first part surface and a second part surface that is adjacent to the first part surface. The first part surface extends towards a casing of the electric SMD component. The second part surface extends away from the casing of the electric SMD component. The soldering process can be implemented on the second part surface by means of a method that is selected from the group: a laser beam soldering process, a light beam soldering process and a thermode soldering process.

As a consequence, the soldering process is not hindered by means of the contact-making holding-down device. In fact, the contact-making holding-down device is arranged at the connection pin in such a manner that it does not come into contact with the laser beam, the light beam or the thermode.

In accordance with a further exemplary embodiment of the disclosure, the contact-making holding-down device of the control unit comprises a lower face that faces towards the second surface. A first spacing extends perpendicular to the circuit board between the tin-plated soldering area and an upper face of the circuit board that is facing the tin-plated soldering area. A second spacing extends perpendicular to the circuit board between the first surface and the second surface of the connection pin. The spacing between the lower face and the circuit board is composed of a total of the first spacing and the second spacing.

The spacing that is produced between the lower face of the contact-making holding-down device and the upper face of the circuit board can be composed of the first spacing that is produced as small as possible and the second spacing that is produced as small as possible. Consequently, the first spacing and the second spacing can refer to the components that have a smallest possible thickness. Consequently, if only the smallest thickness forms the total of the two spacings, it is possible that the contact-making holding-down device is not pre-stressed with respect to the connection pin. However, an arrangement of this type can be practically excluded for reasons of probability so that the contact-making holding-down device is generally always pushed on the connection pin. If, in addition, solder stop lacquer is applied to the upper face of the circuit board and the holding-down device is mounted on an upper face of the solder stop lacquer that is remote from the upper face of the circuit board, the spacing can be reduced by a third spacing that extends perpendicular to the circuit board between the upper face of the circuit board and the upper face of the solder stop lacquer.

In accordance with a further exemplary embodiment of the disclosure, the lower face of the contact-making holding-down device is planar and is embodied essentially parallel to the upper face of the circuit board.

Consequently, surface area contact can be made with the connection pin. Naturally, the lower face can also be embodied by way of example in a spherical manner so that said contact-making holding-down device only contacts the connection pin at points. However, surface area contact provides the advantage that even a slight rotation of the connection pin with respect to the solder area can be compensated for by means of the contact-making holding-down device.

In accordance with a further exemplary embodiment of the disclosure, the contact-making holding-down device of the control unit is connected in a non-detachable manner to a first chamber wall and to a second chamber wall. The first chamber wall and the second chamber wall extend essentially parallel to one another, wherein the first chamber wall and the second chamber wall are spaced apart from one another. The first chamber wall and the second chamber wall extend essentially parallel to a longitudinal extension direction of the connection pin. The first chamber wall and the second chamber wall extend essentially in a perpendicular manner towards an upper face of the circuit board. The first chamber wall and the second chamber wall are fixedly connected to the circuit board. The connection pin extends between the first chamber wall and the second chamber wall.

The chamber walls render it possible to prevent any possible solder splatter during the soldering process from forming an electrically conductive bridge between mutually adjacent connection pins and as a result causing a short circuit. Furthermore, the chamber walls render it possible during the operation to prevent electrically conductive chips from bridging two connection pins. The chamber walls in conjunction with the contact-making holding-down device also provide protection for the connection pins during transportation of the unsoldered control unit by way of example to the soldering station.

In accordance with a further exemplary embodiment of the disclosure, the first chamber wall, the second chamber wall and the holding-down device are arranged in an H-shaped manner.

Generally, the chamber walls form the limbs, and the holding-down device forms the intermediate part. In particular, it is possible by means of an embodiment of this type to position the chamber walls in such a manner that they are longer in length that the length of the soldering area. The chamber walls can protrude beyond the soldering area both in the direction of the casing of the SMD component and also in the opposite direction.

In accordance with a further exemplary embodiment of the disclosure, a transverse wall is connected in a non-detachable manner to the first chamber wall and the second chamber wall. The transverse wall extends essentially in parallel to the contact-making holding-down device. The transverse wall is spaced at a distance from the contact-making holding-down device. The transverse wall is spaced further apart from the casing of the electric SMD component than the contact-making holding-down device. The transverse wall is fixedly connected to the circuit board. The first chamber wall, the second chamber wall, the transverse wall, the contact-making holding-down device and the circuit board define a chamber and a fluid-tight material can be introduced into the chamber.

This material can be introduced by way of example by means of a dispenser. The fluid-tight material can be by way of example a lacquer or a potting compound, in particular an elastically reversible deformable potting compound. In particular, an elastically reversible deformable potting compound provides the advantage that it can compensate for the relative movement between the individual components with respect to one another as a result of different coefficients of thermal expansion.

In accordance with a further exemplary embodiment of the disclosure, the first chamber wall, the second chamber wall and the contact-making holding-down device are embodied in a frame. The electric SMD component is surrounded by the frame in an annular manner.

By virtue of the fact that the frame represents a closed structure, it is warp resistant. This can render it easier to handle the frame. In particular, the closed structure prevents the frame to a great extent from becoming stuck in other components.

In accordance with a further exemplary embodiment of the disclosure, the frame of the control unit is fixedly connected to the circuit board.

The fixed connection can be achieved by way of example by means of adhesive, clips, rivets or screws. If the circuit board is sealed by means of a solder stop lacquer, then the frame generally lies on top of the solder stop lacquer.

In accordance with a further exemplary embodiment of the disclosure, the frame of the control unit is embodied from an electrically non-conductive material.

Consequently, it is necessary prior to the assembly of the frame, or rather of the contact-making holding-down device, that the individual connection pins are not electrically insulated. In particular, it is possible to manufacture the frame from synthetic material using injection molding technology, said synthetic material can also be reinforced with fibers.

In accordance with a further exemplary embodiment of the disclosure, the frame is manufactured from polyamide 4 (PA4).

In particular, this polyamide is ideally suited for an application of this type as it is thermally stable. Consequently, the temperatures that occur during the soldering process and during the operation in the automatic transmission cannot damage this material.

In accordance with a further exemplary embodiment of the disclosure, a component holding-down device is fixedly connected to the frame, wherein the electric SMD component is pushed down in the direction of the circuit board by means of the component holding-down device.

As a consequence, it is not necessary to fix the electric SMD component in a dedicated manner, such as for example by means of an adhesive. Furthermore, the electric SMD component can be both positioned and also fixed by means of the frame during the process of assembling the frame on the circuit board. It is not necessary for the electric SMD component to lie against the circuit board. Also, the circuit board can comprise an aperture in which the electric SMD component is arranged. The circuit board generally surrounds the electric SMD component. The circuit board for its part can be connected in a non-detachable manner to a continuous carrier plate. Consequently, the electric SMD component can be pressed by means of the component holding-down device against the carrier plate in a thermally efficient conductive manner. The carrier plate can be manufactured by way of example from an aluminum alloy and can be used as a heat sink. Thermal resistances between the carrier plate and the electric SMD component do not occur owing to the fact that the electric SMD component is in direct contact with the carrier plate. A thermal resistance can represent by way of example an adhesive joint between the carrier plate and the electric SMD component.

In accordance with a further exemplary embodiment of the disclosure, the circuit board is connected in a non-detachable manner to a carrier plate. The circuit board comprises an aperture and the electric SMD component is arranged in the aperture. The electric SMD component is connected to the carrier plate in a thermally efficient conductive manner.

The electric SMD component can be adhered to the carrier plate by way of example by means of a thermal conductive adhesive. The heat that is generated by the electric SMD component can be transmitted rapidly into the carrier plate that is functioning as a heat sink. It is also possible that the component holding-down device of the frame pushes the electric SMD component against the carrier plate. The electric SMD component is fixed to the carrier plate in such a manner that vibrations and also acceleration forces cannot change the position of the electric SMD component with respect to the circuit board, or rather with respect to the solder joints.

In accordance with a further exemplary embodiment of the disclosure, the electric SMD component is not suitable for a soldering process using a reflow oven.

Consequently, it is also possible to process electric SMD components that already comprise solder joints inside and that could otherwise possibly be damaged during a soldering process using a reflow oven. Consequently, the electric SMD component can be embodied as a complete electronic control system.

In accordance with a further exemplary embodiment of the disclosure, an automatic transmission having a previously described control unit is provided. The automatic transmission comprises a transmission housing, wherein the control unit is arranged in the transmission housing.

It is to be noted that ideas relating to the disclosure are described herein in conjunction both with a control unit for a motor vehicle and also with an automatic transmission. It is clear to a person skilled in the art that the individual described features can be combined with one another in order in this manner also to arrive at other embodiments of the disclosure.

BRIEF DESCRIPTION OF THE DRAWINGS

Embodiments of the disclosure are described hereinunder with reference to the attached figures. The figures are only schematic and are not true-to-scale.

DETAILED DESCRIPTION

Figure 1:
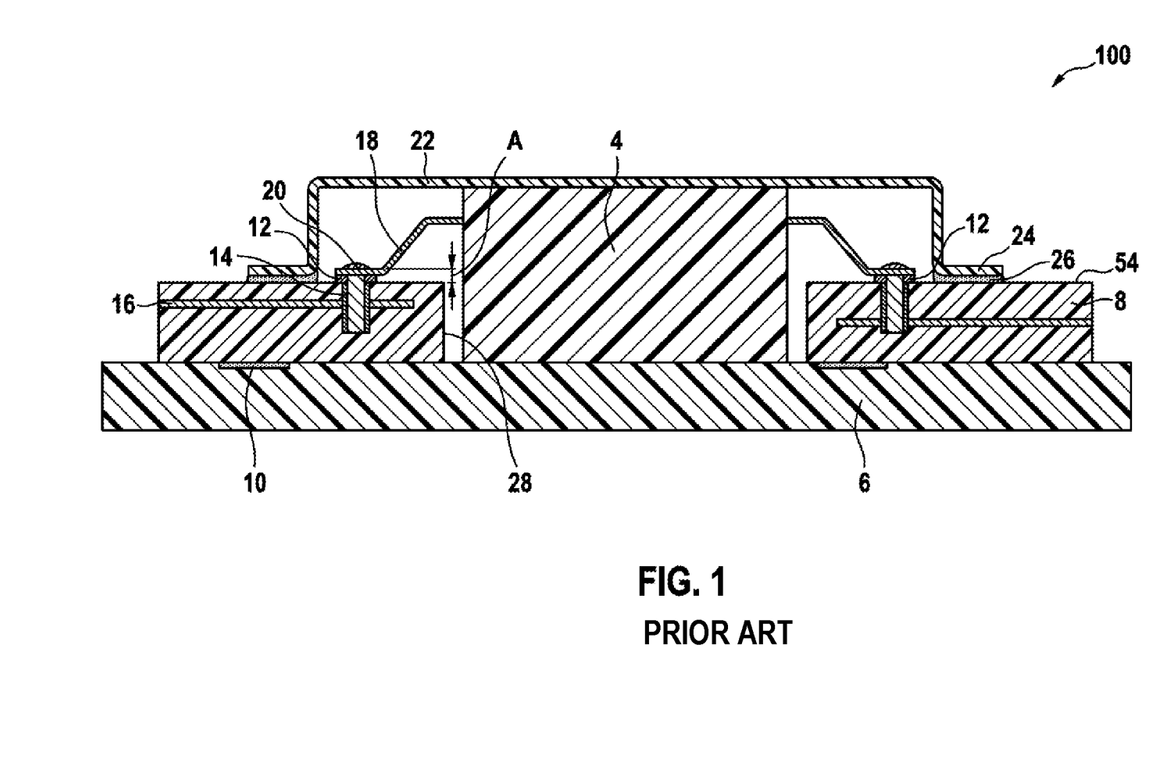
FIG. 1 illustrates a cross sectional view of a control unit according to the prior art, wherein an electric SMD component is connected to a carrier plate and the connection pins of said electric SMD component are bonded to soldering areas of a circuit board.

FIG. 1 illustrates a control unit 100 according to the prior art. An electric SMD (surface-mounted device) component 4 is fixedly connected to a carrier plate 6. A circuit board 8 is fixedly connected by means of a first circumferential adhesive arrangement 10 in a fluid tight manner to the carrier plate 6. The circuit board 8 comprises a solder area 12 on its upper face 54 that is remote from the carrier plate 6. The solder area 12 is connected in an electrically conductive manner to a VIA (vertical interconnect access) 14, in other words a perpendicular through connection between electrically conductive layers within the circuit board 8. In the present exemplary embodiment, the VIA 14 is connected in an electrically conductive manner to an electrically conductive conductor track 16 that extends within the circuit board 8. The electric SMD component 4 comprises a first connection pin 18 that is connected in an electrically conductive manner to the soldering area 12 by means of solder 20. A predefined spacing A is provided between the first connection pin 18 and the circuit board 8, or rather its upper face 54. A bath-shaped chip protector cover 22 that has a rim 24 that faces the circuit board 8 is connected in a fluid-tight manner to the circuit board 8, in that the rim 24 is adhered by means of a second circumferential adhesive arrangement 26 to the upper face 54 of the circuit board 8. The circuit board 8 comprises an aperture 28 in which the electric SMD component 4 is arranged. Consequently, the electric SMD component 4 is circumferentially surrounded by the circuit board 8. This arrangement provides protection for the electric SMD component 4 against a fluid that is surrounding the control unit 100.

Figure 2:
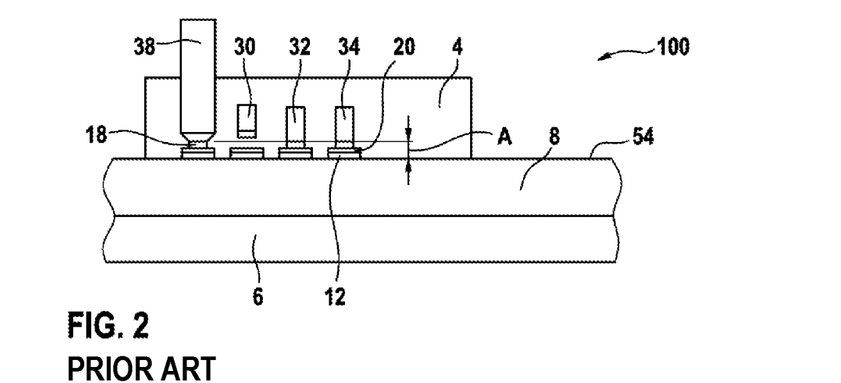
FIG. 2 illustrates a front view of an arrangement according to the prior art having a connection pin that is not soldered in a proper manner, and a solder thermode during the soldering process.

FIG. 2 illustrates an arrangement according to the prior art where a second connection pin 30 is not soldered in a proper manner following the soldering process. A second connection pin 30, a third connection pin 32 and a fourth connection pin 34 are provided in addition to the first connection pin 18. It is evident in the left-hand illustration how a thermode 38 pushes the first connection pin 18 against the soldering area 12 that is tin-plated with the solder 20. In the case of the connection pins 30, 32, 34 that are illustrated on the right-hand side of the first connection pin 18, the soldering process has already been performed by means of the thermode 38. In order to produce an optimal solder joint at the electric SMD component 4, it is necessary for the connection pin 18, 30, 32, 34 to be at a predefined spacing A from the upper face 54 of the circuit board 8. In the exemplary embodiment described here, the predefined spacing A is illustrated, whereas only the first connection pin 18, the third connection pin 32 and the fourth connection pin 34 maintain the required predefined spacing A. The second connection pin 30 exceeds the predefined spacing A in such a manner that following the soldering process using the thermode 38 there is no electrically conductive connection to the soldering area 12. In many cases, this is as a result of the fact that there was already an excessively large spacing A between the second connection pin and the soldering area 12 at the commencement of the soldering process. Although the second connection pin 30 was pushed by means of the thermode 38 against the soldering area 12 as a result of the thermode soldering process and in doing so the solder 20 was liquefied, following the removal of the thermode 38 restoring forces that are present in the second connection pin 30 did in fact pull the second connection pin 30 out of the liquid solder 20.

Figure 3:
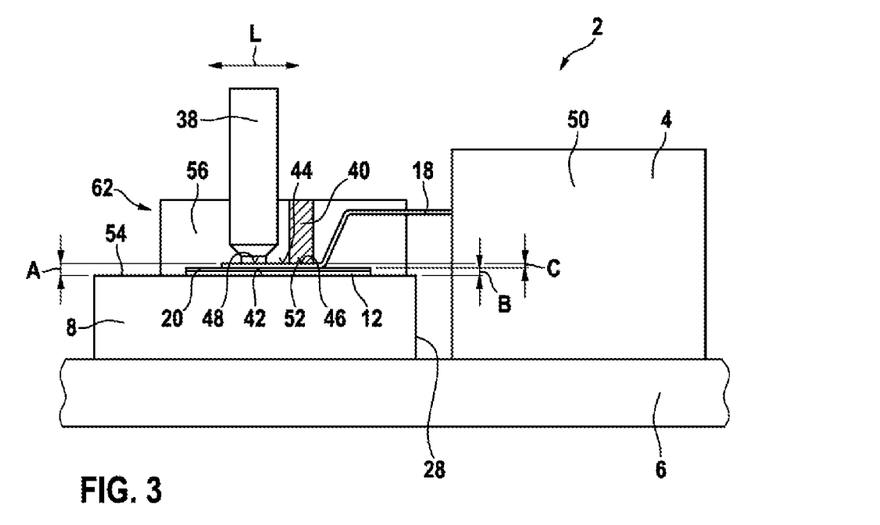
FIG. 3 illustrates a lateral view of a control unit, wherein the electric SMD component is connected to the carrier plate, wherein a connection pin of the electric SMD component is pushed against the tin-plated soldering area of the circuit board by means of a contact-making holding-down device.

FIG. 3 illustrates a control unit 2 in which the electric SMD component 4 is likewise connected to the carrier plate 6. For reasons of clarity, a solder lacquer is not shown on the upper face 54 of the circuit board 8 in FIG. 3 and in the figures following. The first connection pin 18 is pushed by means of a contact-making holding-down device 40 against the soldering area 12 that has been tin-plated by means of solder 20. The first connection pin 18 comprises a first surface 42 that faces the soldering area 12, and a second surface 44 that lies opposite the first surface 42. The second surface 44 is divided into a first part surface 46 and a second part surface 48, wherein the first part surface 46 extends towards a casing 50 of the electric SMD component 4. The second part surface 48 is adjacent to the first part surface 46 and extends accordingly away from the casing 50 of the electric SMD component 4. The contact-making holding-down device 40 pushes against the first part surface 46 and consequently against the second surface 44. The soldering process is performed on the second part surface 48. In the case of the exemplary embodiment described here, the soldering process is performed by means of the already known thermode 38. However, the soldering process can also be performed using a light beam or a laser beam. The contact-making holding-down device 40 comprises a lower face 52 that is planar in the exemplary embodiment described here and is embodied essentially parallel to the upper face 54 of the circuit board 8. An arrangement of this type of the lower face 52 renders it possible to compensate for small rotations of the first connection pin 18 with respect to the soldering area 12. Moreover, a first chamber wall 56 is connected in a non-detachable manner to the contact-making holding-down device 40. The first chamber wall 56 is fixedly connected to the upper face 54 of the circuit board 8. Furthermore, the contact-making holding-down device 40 and the first chamber wall 56 are integrated into a frame 62. In addition, it is evident that the first chamber wall 56 extends in a longitudinal extension direction L of the first connection pin 18. Furthermore, the first chamber wall protrudes beyond the soldering area 12 in both directions of the longitudinal extension direction L. Moreover, in this case the first chamber wall 56 extends perpendicular to the upper face 54 of the circuit board 8 higher than the first connection pin 18. The lower face 52 of the contact-making holding-down device 40 is spaced apart from the upper face 54 of the circuit board 8 at the predefined spacing A. The predefined spacing A is the total of a first spacing B and a second spacing C. The first spacing B extends perpendicular to the upper face 54 of the circuit board 8 between the soldering area 12 that is tin-plated with solder 20 and the upper face 54 of the circuit board 8. The second spacing C extends perpendicular to the upper face 54 of the circuit board 8 between the first surface 42 and the second surface 44 of the first connection pin 18.

Figure 4:
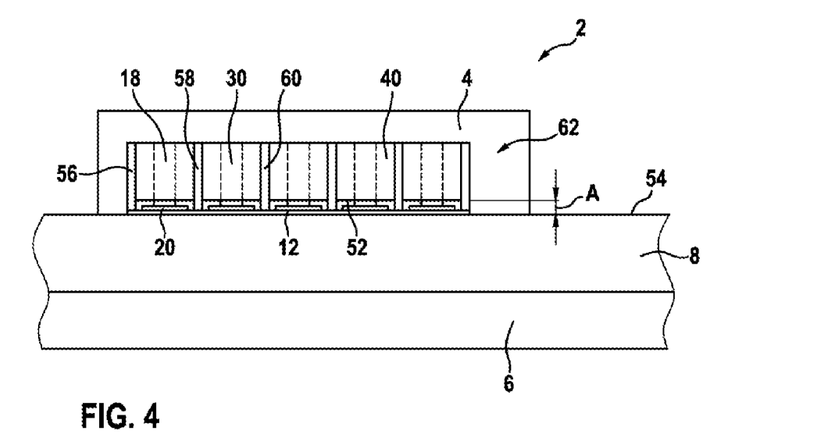
FIG. 4 illustrates a frontal view of the control unit that is known from FIG. 3.

FIG. 4 illustrates a frontal view of the section known from FIG. 3 of the control unit 2. Five connection pins 18, 30 are arranged adjacent to one another and all comprise the identical spacing A of the lower face 52 of the contact-making holding-down device 40 from the upper face 54 of the circuit board 8. As a consequence, each connection pin 18, 30 can be soldered 40 from the upper face 54 of the circuit board 8 in uniform spacings to the soldering area 12. Moreover, the contact-making holding-down device 40 is connected to a second chamber wall 58 in a non-detachable manner. The second connection pin 30 is arranged adjacent to the first connection pin 18. The second connection pin 30 is likewise pushed by means of the contact-making holding-down device 40 against the soldering area 12 that is tin-plated with solder 20. The first chamber wall 56 and the second chamber wall 58 are arranged parallel to one another and spaced apart from one another in such a manner that the first connection pin 18 can extend between the first chamber wall 56 and the second chamber wall 58. The illustration described here also applies to the second connection pin 30 that is accordingly flanked by the second chamber wall 58 and the third chamber wall 60. The chamber walls 56, 58, 60 and the contact-making holding-down device 40 are integrated into the frame 62 that is more easily evident in FIG. 5.

Figure 5:
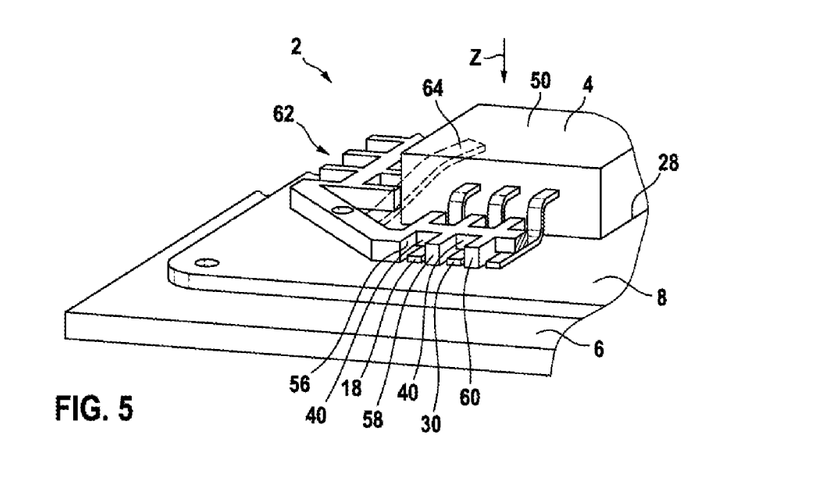
FIG. 5 illustrates a 3D view of the control unit that is known from FIGS. 3 and 4.

FIG. 5 illustrates a 3D view of a section of the control unit 2 that is known from FIGS. 3 and 4. It is clearly evident how the contact-making holding-down device 40 pushes down the connection pins 18, 30. Furthermore, it is evident that the first chamber wall and the second chamber wall 58 are embodied in conjunction with the contact-making holding-down device 40 in an H-shaped manner, wherein the two chambers 56, 58 each form a limb, and the contact-making holding-down device 40 forms an intermediate part. A component holding-down device 64 that is illustrated in this figure as a broken line is connected to the frame 62 in a non-detachable manner. This component holding-down device 64 pushes the casing 50 of the electric SMD component 4 against the carrier plate 6 in a direction Z that is perpendicular with respect to the circuit board 8. Consequently, it is possible to forego a further fixing arrangement such as by way of example an arrangement whereby the casing 50 is adhered to the carrier plate 6. By virtue of the fact that the casing 50 lies against the carrier plate 6, it is possible to transmit the heat that is generated by the electric SMD component 4 directly into the carrier plate 6 that is embodied as a heat sink. Naturally, the frame 62 is spanned by a cover, such as the one known in FIG. 1 as the chip protector cover 22, so that a fluid-tight connection can be produced between the cover and the circuit board 8 and also between the circuit board 8 and the carrier plate 6. Accordingly, it is not possible for any fluid that is surrounding the control unit 2 to arrive at the component 4. Naturally, the connection pins 18, 30 could also be protected in that said connection pins are protected by way of example by means of a lacquer and a potting compound from coming into contact with the fluid. The arrangement prevents the electrically conductive chips that are present in the automatic transmission oil from arriving at the connection pins 18, 30. The chamber walls 56, 58, 60 also prevent solder splatter during the soldering process from bridging mutually adjacent connection pins 18, 30 and as a result causing a short circuit during the operation. The contact-making holding-down device 40 acts in a damping manner in the case of a vibration loading being exerted on the electrically conductive connection of the connection pins 18, 30 to the soldering area 12 and consequently prevents this solder joint from being shattered during the operation. The frame 62 together with the chamber walls 56, 58, 60 and the contact-making holding-down device 40 are embodied as one piece from polyamide 4 (PA4). In the exemplary embodiment described here, only a section of the frame 62 is illustrated. The frame 62 surrounds the electric SMD component 4 in an annular manner.

Figure 6:
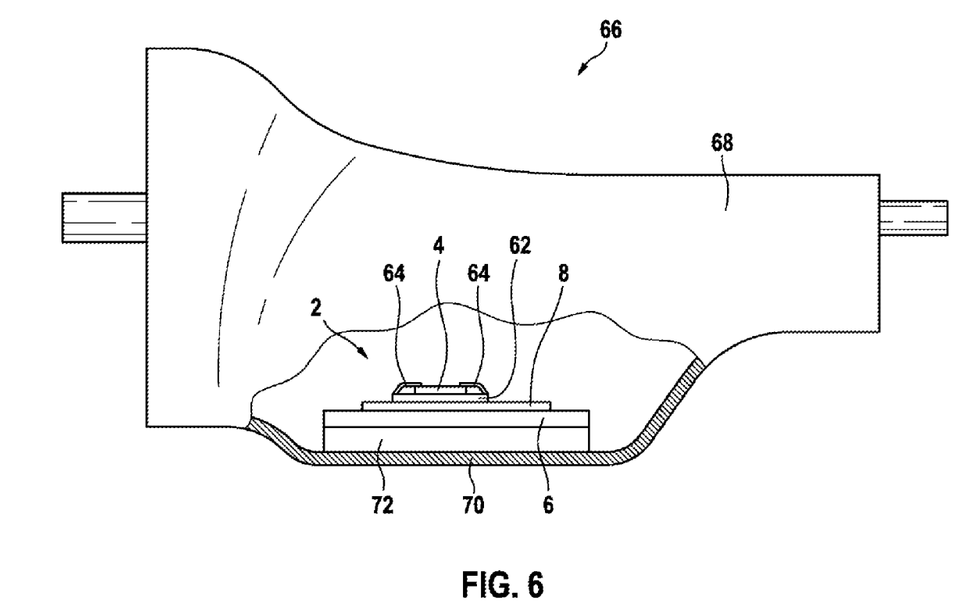
FIG. 6 illustrates an X-ray view of the control unit that is known from FIG. 5 and is arranged in an automatic transmission.

FIG. 6 illustrates an automatic transmission 66 having a transmission housing 68 and an oil pan 70. A hydraulic plate 72 is arranged in the oil pan 70 and the carrier plate 6 of the control unit 2 is connected to said hydraulic plate in a thermally efficient conductive manner. Consequently, the oil pan 70 can be cooled by means of the air flow during the operation of the vehicle, not illustrated. Accordingly, heat that is generated in the electric SMD component 4 is then transmitted into the carrier plate 6 and from there into the hydraulic plate 72. The hydraulic plate 72 then transmits the heat into the oil pan 70.

The invention claimed is:
1. A control unit for a motor vehicle, said control unit comprising:
an electric surface-mounted device component, including:
at least one corresponding connection pin; and
a circuit board, wherein:
the circuit board includes at least one soldering area, the at least one soldering area connected to the circuit board in a non-detachable manner, the at least one soldering area and the at least one corresponding connection pin configured to be connected to one another in a bonded, electrically conductive manner by a soldering process,
a contact-making holding-device is fixedly connected to the circuit board, and
the at least one corresponding connection pin is positioned by the contact-making holding-device such that when the at least one corresponding connection pin is bonded to the at least one soldering area, the at least one corresponding connection pin and the circuit board are at a predefined spacing from one another.
2. The control unit as claimed in claim 1, wherein:
the at least one corresponding connection pin includes a first surface and a second surface that lies opposite the first surface, the first surface configured to face the at least one soldering area, and the second surface acted upon by the contact-making holding-device.
3. The control unit as claimed in claim 2, wherein:
the second surface includes a first part surface and a second part surface that is adjacent to the first part surface, the first part surface configured to extend towards a casing of the electric surface-mounted device component, the second part surface configured to extend away from the casing of the electric surface-mounted device component, and
the soldering process is performed on the second part surface by one of: a laser beam soldering method, a light beam soldering method, and a thermode soldering method.
4. The control unit as claimed in claim 1, wherein:
the contact-making holding-device is connected to a first chamber wall and a second chamber wall in a non-detachable manner, the first chamber wall and the second chamber wall extending essentially parallel to one another, the first chamber wall and the second chamber wall spaced apart from one another, the first chamber wall and the second chamber wall extending essentially parallel to a longitudinal extension direction of the at least one corresponding connection pin, the first chamber wall and the second chamber wall extending essentially perpendicular to an upper face of the circuit board, and the first chamber wall and the second chamber wall fixedly connected to the circuit board, and the at least one corresponding connection pin is configured to extend between the first chamber wall and the second chamber wall.

5. The control unit as claimed in claim 4, wherein:

the first chamber wall, the second chamber wall and the contact-making holding-down device are embodied in a frame, and the electric surface-mounted device component is surrounded by the frame in an annular manner.

6. The control unit as claimed in claim 5, wherein the frame is fixedly connected to the circuit board.

7. The control unit as claimed in claim 5, wherein the frame is produced from an electrically non-conductive material.

8. The control unit as claimed in claim 5, wherein:

a component holding-down device is fixedly connected to the frame, and the electric surface-mounted device component is configured to be pushed down in the direction of the circuit board by the component holding-down device.

9. The control unit as claimed in claim 1, wherein:

the circuit board is connected to a carrier plate in a non-detachable manner, the circuit board includes an aperture, the electric surface-mounted device component is arranged in the aperture, and the electric surface-mounted device component is connected to the carrier plate such that heat generated by the electric surface-mounted device component is transmitted into the carrier plate.

10. An automatic transmission, comprising:

a transmission housing; and a control unit, including:

an electric surface-mounted device component including:

at least one corresponding connection pin; and a circuit board, wherein:

the circuit board includes at least one soldering area, the at least one soldering area is connected to the circuit board in a non-detachable manner, the at least one soldering area and the at least one corresponding connection pin configured to be connected to one another in a bonded, electrically conductive manner by a soldering process, a contact-making holding-device is fixedly connected to the circuit board, the at least one corresponding connection pin is positioned by the contact-making holding-device such that when the at least one corresponding connection pin is bonded to the at least one soldering area, the at least one corresponding connection pin and the circuit board are at a predefined spacing from one another, and the control unit is arranged in the transmission housing.

* * * * *